(12) United States Patent
Li

(10) Patent No.: US 12,369,304 B2
(45) Date of Patent: Jul. 22, 2025

(54) SEMICONDUCTOR STRUCTURE AND A METHOD OF MAKING THE SAME

(71) Applicant: ChangXin Memory Technologies, Inc., Hefei (CN)

(72) Inventor: Xiaojie Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/908,295

(22) PCT Filed: Jul. 8, 2022

(86) PCT No.: PCT/CN2022/104756
§ 371 (c)(1),
(2) Date: Aug. 31, 2022

(87) PCT Pub. No.: WO2023/245748
PCT Pub. Date: Dec. 28, 2023

(65) Prior Publication Data
US 2024/0215224 A1 Jun. 27, 2024

(30) Foreign Application Priority Data
Jun. 23, 2022 (CN) .......................... 202210725110.9

(51) Int. Cl.
*H10B 12/00* (2023.01)
*H01L 23/64* (2006.01)

(52) U.S. Cl.
CPC ............. *H10B 12/30* (2023.02); *H10B 12/03* (2023.02); *H10B 12/05* (2023.02); *H10B 12/482* (2023.02); *H01L 23/64* (2013.01); *H10B 12/315* (2023.02)

(58) Field of Classification Search
CPC ........ H10B 12/30; H10B 12/03; H10B 12/05; H10B 12/482; H10B 12/315; H10B 12/00; H01L 23/64; H10D 84/80; H10D 1/716
See application file for complete search history.

(56) References Cited

U.S. PATENT DOCUMENTS 9,698,272 B1 * 7/2017 Ikeda .................. H10D 86/481
11,094,699 B1 8/2021 Brewer et al.
(Continued)

FOREIGN PATENT DOCUMENTS

CN 109616474 A 4/2019
CN 111627885 A 9/2020

OTHER PUBLICATIONS

PCT/CN2022/104756 International Search Report and Written Opinion mailed Jan. 18, 2023.

*Primary Examiner* — Eduardo A Rodela
(74) *Attorney, Agent, or Firm* — Kilpatrick Townsend & Stockton LLP

(57) ABSTRACT

Embodiments of the present disclosure provide a semiconductor device, comprising a semiconductor layer, extending along the first direction; the semiconductor layer includes a capacitor area facing the capacitor structure, and the capacitor structure includes: a lower electrode layer, the capacitor dielectric layer and the upper electrode layer, sequentially surrounding the sidewalls of the capacitor area extending along the first direction, a part of the lower electrode layer surrounds the sidewalls of the capacitor region, and also surrounds the bottom of the upper electrode layer, the sidewalls extending along the first direction, and the capacitor dielectric layer is located between the upper electrode layer and the lower electrode layer. The disclosed device improves the capacitance of the capacitor structure while (Continued)

improving the integration density of the semiconductor structure.

13 Claims, 14 Drawing Sheets

(56) References Cited

U.S. PATENT DOCUMENTS

| | | | | |
|---|---|---|---|---|
| 11,386,950 | B2* | 7/2022 | Park | H10B 12/33 |
| 11,616,065 | B2* | 3/2023 | Kim | H10D 88/00 |
| | | | | 257/296 |
| 11,887,654 | B2* | 1/2024 | Kim | G11C 11/4085 |
| 11,956,942 | B2* | 4/2024 | Okajima | H01L 21/02258 |
| 2004/0219746 | A1* | 11/2004 | Vaartstra | C23C 16/40 |
| | | | | 438/785 |
| 2018/0323199 | A1* | 11/2018 | Roberts | H10D 64/518 |
| 2019/0295626 | A1* | 9/2019 | Ikeda | G11C 11/404 |
| 2022/0399342 | A1* | 12/2022 | Sharma | H10D 84/853 |
| 2023/0138205 | A1* | 5/2023 | Yang | H01L 25/18 |
| | | | | 257/296 |

* cited by examiner

SEMICONDUCTOR STRUCTURE AND A METHOD OF MAKING THE SAME

CROSS REFERENCES TO RELATED APPLICATIONS

This application claims the benefit of priority of Chinese patent application with the application number 202210725110.9, entitled "A Semiconductor Structure and A Method of Making the Same", filed with the China National Intellectual Property Administration on Jun. 23, 2022, the contents of which are incorporated herein by reference in its entirety.

TECHNICAL FIELD

Embodiments of the present disclosure relate to the field of semiconductor technology, and in particular, to a semiconductor structure and a method for manufacturing the same.

BACKGROUND

With the development of dynamic memory devices toward higher level of integration density, not only it is important to study the arrangement of transistors in the dynamic memory array structure and how to reduce the size of a single functional device in the dynamic memory array structure, it is also necessary to improve the electrical performance of functional devices with small sizes.

However, as the demand for capacitive structures of large capacitance has increased, it has been difficult to control the size of the capacitive structures, thereby has made it difficult to achieve a balance between the layout space occupied by the capacitive structures in the dynamic memory and the capacitance of the capacitive structures.

SUMMARY

The present embodiment of the present disclosure provides a semiconductor structure and a manufacturing method thereof, which are at least beneficial to improve the capacitance of the capacitor structure while improving the integration density of the semiconductor structure.

According to some embodiments of the present disclosure, one of the embodiments of the present disclosure provides a semiconductor structure, comprising: a bit line, a transistor structure and a capacitor structure sequentially arranged along a first direction. The transistor structure and the capacitor structure both include a semiconductor layer, and the semiconductor layer extends along the first direction; wherein, the semiconductor layer includes a capacitor region opposite to the capacitor structure, so the capacitor structure at least includes: a lower electrode layer, a capacitor dielectric layer and an upper electrode layer sequentially surrounding the sidewalls of the capacitor region extending along the first direction, and at least part of the lower electrode layer is surrounded by the capacitor region along the edge. The sidewalls extending in the first direction also surrounds the bottom of the upper electrode layer and the sidewalls extending along the first direction, and the capacitor dielectric layer is located on the upper electrode layer and the lower electrode layer. between electrode layers.

In some embodiments, the lower electrode layer itself surrounds a first annular groove, and the direction of the bottom of the first annular groove pointing to the notch is the first direction; the capacitive dielectric layer covers the bottom and side walls of the first annular groove, and the capacitor dielectric layer itself surrounds a second annular groove, and the direction of the bottom of the second annular groove pointing to the notch is the first direction; the upper electrode layer fills the second annular groove.

In some embodiments, on a cross-section perpendicular to the first direction, the cross-sectional shape of the first annular groove and the cross-sectional shape of the second annular groove include a circular ring or a square.

In some embodiments, along the first direction, the capacitor region has an end face away from the transistor structure, the capacitor dielectric layer covers the end face, and the upper electrode layer covers the side of the capacitor's dielectric layer away from the end face.

In some embodiments, the upper electrode layer comprises a diffusion barrier layer and an electrical connection layer stacked in sequence, the diffusion barrier layer covers the surface of the capacitor dielectric layer away from the lower electrode layer, the electrical connection layer covers the surface of the diffusion barrier layer away from the capacitor's dielectric layer.

In some embodiments, the transistor structure includes a plurality of sub-transistor structures spaced along a third direction, the capacitor structure includes a plurality of sub-capacitor structures spaced along the third direction, the semiconductor layer includes a plurality of sub-semiconductor layers spaced along the third direction, and the sub-transistor structures correspond to the sub-capacitor structures one-to-one; along the first direction, the sub-semiconductor layers include a first region and a sub-capacitor area, the end face of the first area away from the sub-capacitor area is in contact with the bit line; the sub-transistor structure includes the first area and a gate structure, and the gate structure surrounds part of the sidewalls of the first region extending along the first direction; the sub-capacitor structure includes the sub-capacitor region and the lower electrode layer, part of the capacitor dielectric layer and part of the upper electrode layer stacked in sequence, and the lower electrode layer surrounds The sidewalls of the sub-capacitor regions extending along the first direction, the lower electrode layer and the sub-capacitor regions are in one-to-one correspondence.

In some embodiments, the length of the lower electrode layer in the first direction is less than or equal to the length of the sub-capacitor region in the first direction.

In some embodiments, the capacitor dielectric layer is shared by a plurality of the sub-capacitor structures arranged at intervals along the third direction in the same capacitor structure.

In some embodiments, the upper electrode layer is shared by a plurality of the sub-capacitor structures arranged at intervals along the third direction in the same capacitor structure.

According to some embodiments of the present disclosure, another aspect of the embodiments of the present disclosure also provides a method for manufacturing a semiconductor structure, comprising: forming a bit line, a transistor structure and a capacitor structure sequentially arranged along a first direction, the capacitor The structure extends along the first direction, and both the transistor structure and the capacitor structure include a semiconductor layer, and the semiconductor layer extends along the first direction; wherein, the semiconductor layer includes a positive electrode with the capacitor structure. For the capacitor region, the capacitor structure at least includes: a lower electrode layer, a capacitor dielectric layer and an upper electrode layer sequentially surrounding the sidewalls of the capacitor region extending along the first direction, and at least part of the lower electrode layer is in the first direction. While surrounding the sidewalls of the capacitor region extending along the first direction, it also surrounds the bottom of the upper electrode layer and the sidewalls extending along the first direction, and the capacitor dielectric layer is located on the upper between the electrode layer and the lower electrode layer.

In some embodiments, the step of forming the bit line and the transistor structure includes forming a plurality of spaced apart bit lines and a plurality of spaced apart transistors along a second direction structure, and the bit lines are in one-to-one correspondence with the transistor structures, a plurality of the transistor structures all include a part of the gate structure, the gate structure extends along the second direction, and the first direction and the second direction intersect.

In some embodiments, the step of forming the bit line and the transistor structure further comprises: forming a plurality of spaced sub-transistor structures and a plurality of spaced sub-semiconductor layers along the third direction, wherein at least part of the sub-transistor structures arranged along the third direction constitute the transistor structure, and at least part of the sub-semiconductor layers arranged along the third direction constitute the semiconductor layer.

In some embodiments, along the first direction, the sub-semiconductor layer includes a first region and a sub-capacitor region, and the first region is opposite to the sub-transistor structure; the steps forming the sub-capacitor structure include: forming a first dielectric layer, the first dielectric layer is located between the adjacent sub-capacitor regions, and there is a third annular groove between the first dielectric layer and the sub-capacitor regions, the direction from the bottom of the third annular groove to the notch is the first direction, and the third annular groove corresponds to the sub-capacitor regions one-to-one; a lower electrode layer is formed, and the lower electrode layer covers the third annular groove the bottom and side walls of the bottom electrode layer, and the lower electrode layer itself forms a first annular groove, the direction of the bottom of the first annular groove pointing to the notch is the first direction, and the lower electrode layer and the sub-capacitor The areas are in one-to-one correspondence; a capacitor dielectric layer is formed, the capacitor dielectric layer covers at least the bottom and sidewalls of the first annular groove, and the capacitor dielectric layer itself surrounds a second annular groove, and the second annular groove is formed by the capacitor dielectric layer. The direction from the bottom of the annular groove to the notch is the first direction; an upper electrode layer is formed, and the upper electrode layer at least fills the second annular groove; wherein, the sub-capacitor region, the lower electrode layer, part of the capacitor dielectric layer and part of the upper electrode layer constitute the sub-capacitor structure.

In some embodiments, along a cross section perpendicular to the first direction, the cross-sectional shape of the third annular groove includes a circular ring or a square.

In some embodiments, the step of forming the lower electrode layer includes: forming an initial lower electrode layer, the initial lower electrode layer conformally covers the first dielectric layer and the first dielectric layer exposed by the third annular groove. the surface of the sub-capacitor region; the initial lower electrode layer is etched to remove the initial lower electrode layer located on the end face of the sub-capacitor region away from the first region, and the remaining initial lower electrode layer is used as the lower electrode layer.

In some embodiments, the step of forming the first dielectric layer and the third annular groove includes: forming a second dielectric layer, the second dielectric layer is located in the sub-capacitor region along the first sidewalls extending in the direction, and there is a space between the adjacent second dielectric layers; forming a first dielectric layer, the first dielectric layer is located in the space, and the first dielectric layer exposes a part of the second dielectric layer; removing the second dielectric layer by using the first dielectric layer as a mask to form the third annular groove.

In some embodiments, the step of forming the first dielectric layer further comprises: forming an initial first dielectric layer, the initial first dielectric layer fills the space, and the initial first dielectric layer covers the end face of the second dielectric layer away from the first region; the initial first dielectric layer is etched to expose at least the end face of the second dielectric layer away from the first region, leaving the initial first dielectric layer as the first dielectric layer.

The technical scheme provided by the embodiments of the present disclosure has at least the following advantages:

in the capacitor structure, at least part of the lower electrode layer also surrounds the bottom of the upper electrode layer and the sidewalls extending along the first direction, while surrounding the sidewalls of the capacitor region extending in the first direction, and the lower electrode layer. The capacitor dielectric layer and the upper electrode layer sequentially surround the sidewalls of the capacitor region extending along the first direction. It can be understood that the upper electrode layer surrounds the sidewalls of the capacitor region extending along the first direction, that is, the upper electrode layer is provided on both sides of the capacitor region along the direction perpendicular to the first direction. Surrounding the sidewalls and bottom of the upper electrode layer will make the upper electrode layer have lower electrode layers on both sides perpendicular to the first direction, that is, any one of the two sides of the capacitor region along the direction perpendicular to the first direction. Both sides have two lower electrode layers extending along the first direction, and the two lower electrode layers are in contact so connected to each other. In this way, it is beneficial to reduce the layout length of the lower electrode layer in the first direction, while increasing the upper electrode layer. The facing area between the layer and the lower electrode layer, thereby increasing the capacitance of the capacitive structure[JJI][A&B2].

It can be understood that the layout space of the capacitor structure in the semiconductor structure mainly depends on the length of the lower electrode layer in the first direction, and under the condition of the same capacitance, the length of the lower electrode layer in the first direction is reduced, which is beneficial to reduce the layout length of the capacitor structure in the first direction, thereby facilitating the integration of more capacitor structures in the semiconductor structure per unit area, so as to improve the integration density of the semiconductor structure. Therefore, the semiconductor structure provided by the embodiments of the present disclosure is beneficial to increasing the capacitance of the capacitor structure while improving the integration density of the semiconductor structure.

BRIEF DESCRIPTION OF THE DRAWINGS

One or more embodiments are exemplified by the pictures in the accompanying drawings corresponding thereto, and these exemplifications do not constitute limitations to the embodiments, and elements with the same reference numerals in the drawings are represented as similar. Unless otherwise stated, the figures in the accompanying drawings do not constitute a scale limitation; in order to more clearly illustrate the embodiments of the present disclosure or the technical solutions in the traditional technology, the following will briefly describe the accompanying drawings used in the embodiments. Introduction, it is obvious that the drawings in the following description are only some embodiments of the present disclosure, and for those of ordinary skill in the art, other drawings can also be obtained from these drawings without creative effort.

DETAILED DESCRIPTION OF THE PREFERRED EMBODIMENTS

The present disclosure provides a semiconductor structure and a manufacturing method thereof. In the semiconductor structure, the lower electrode layer, the capacitor dielectric layer and the upper electrode layer sequentially surround the sidewalls of the capacitor region extending along the first direction, and at least part of the lower electrode layer also surrounds the bottom of the upper electrode layer and the sidewalls extending along the first direction while surrounding the sidewalls of the capacitor region extending along the first direction. It can be understood that the upper electrode layer surrounds the sidewalls of the capacitor region extending along the first direction, that is, the upper electrode layer is provided on both sides of the capacitor region along the direction perpendicular to the first direction. Surrounding the sidewalls and bottom of the upper electrode layer will make the upper electrode layer have lower electrode layers on both sides perpendicular to the first direction, that is, any one of the two sides of the capacitor region along the direction perpendicular to the first direction. Both sides have two lower electrode layers extending along the first direction, and the two lower electrode layers are in contact and connected to each other. In this way, it is beneficial to reduce the layout length of the lower electrode layer in the first direction while increasing the upper electrode layer. The facing area between the layer and the lower electrode layer, thereby increasing the capacitance of the capacitive structure. It can be understood that the layout space of the capacitor structure in the semiconductor structure mainly depends on the length of the lower electrode layer in the first direction. Under the condition of the same capacitance, the length of the lower electrode layer in the first direction is reduced, which is beneficial to reducing the layout length of the capacitor structure in the first direction and is also beneficial to integrate more capacitor structures in the semiconductor structure per unit area, so as to improve the integration density of the semiconductor structure. Therefore, the semiconductor structure provided by the embodiments of the present disclosure is beneficial to improve the capacitance of the capacitor structure while improving the integration density of the semiconductor structure.

The embodiments of the present disclosure will be described in detail below with reference to the accompanying drawings. However, those of ordinary skill in the art can appreciate that, in the various embodiments of the present disclosure, many technical details are provided for the reader to better understand the embodiments of the present disclosure. However, even without these technical details and various changes and modifications based on the following embodiments, the technical solutions claimed in the embodiments of the present disclosure can be implemented.

Figure 1:
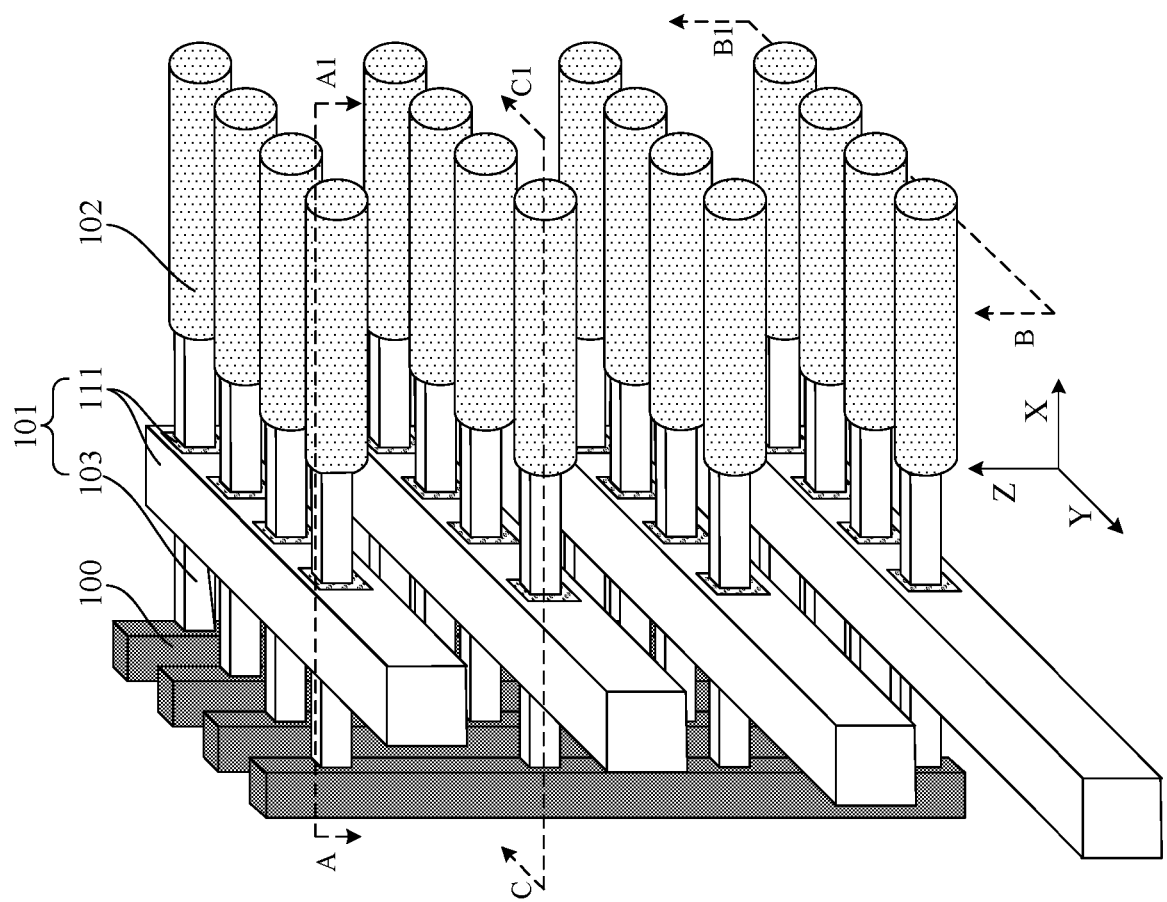
FIG. 1 is a schematic partial three-dimensional structural diagram of a semiconductor structure according to an embodiment of the present disclosure.
Figure 2:
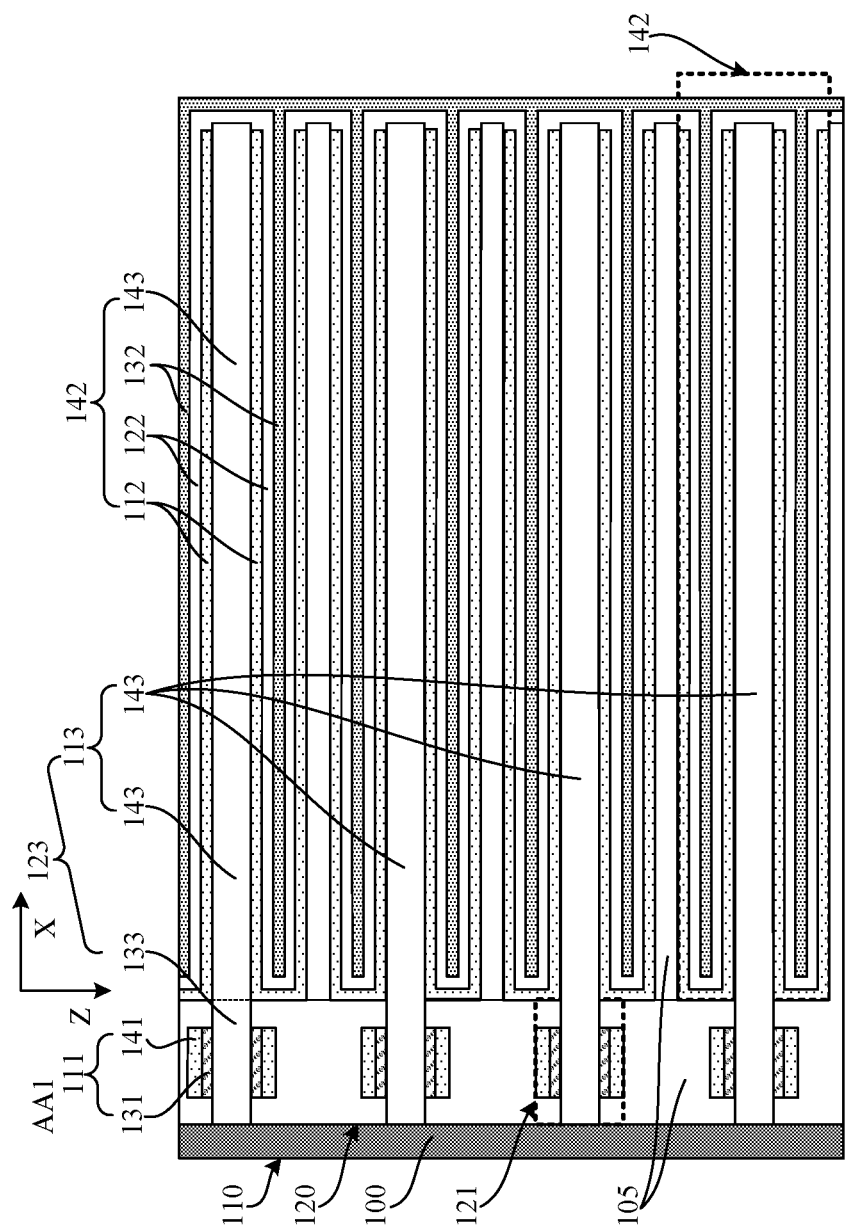
FIG. 2 is a schematic partial cross-sectional view of the semiconductor structure shown in FIG. 1 along the first cross-sectional direction at line AA1.
Figure 3:
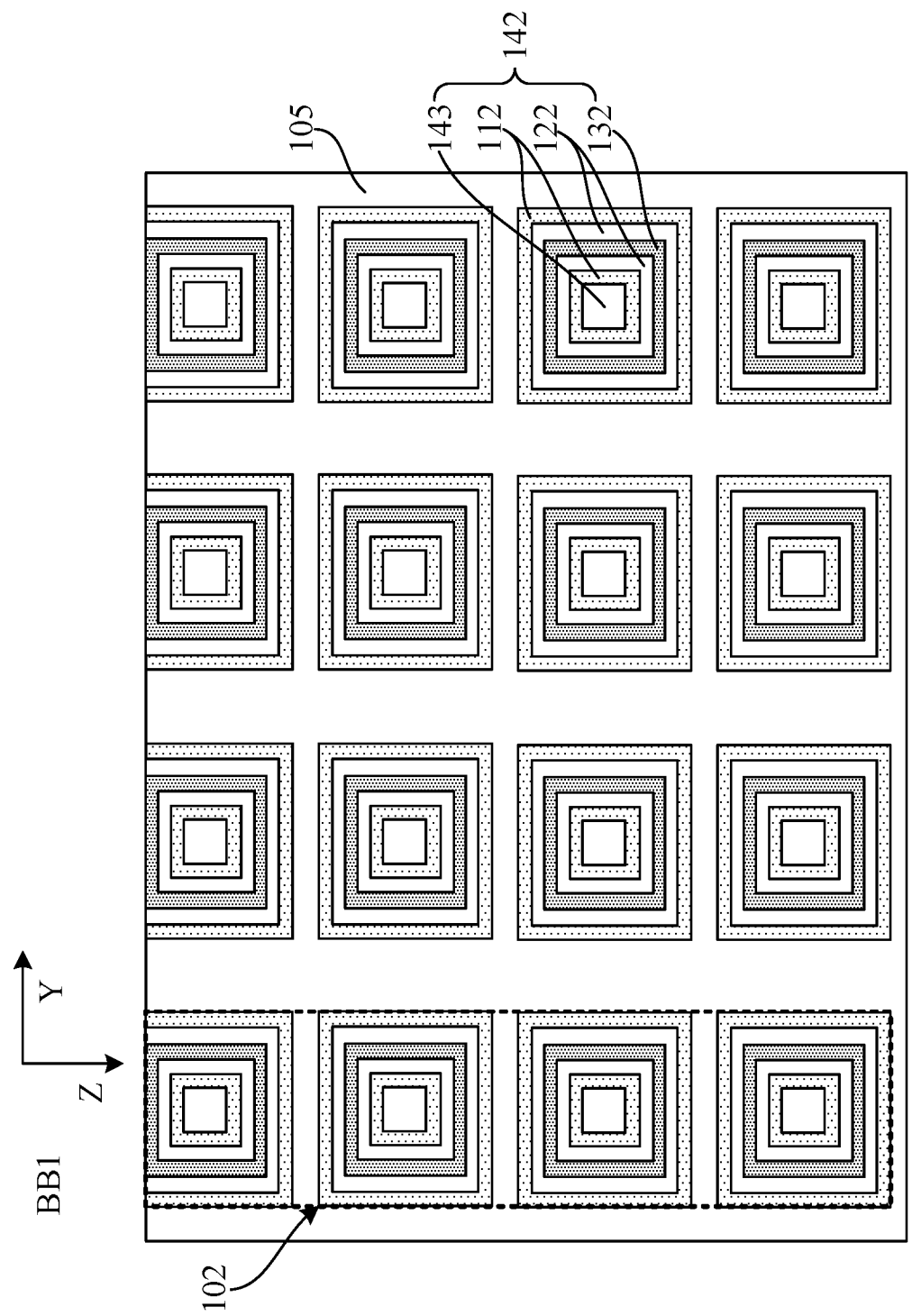
FIG. 3 is a schematic partial cross-sectional view of the semiconductor structure shown in FIG. 1 along the second cross-sectional direction at line BB1.
Figure 4:
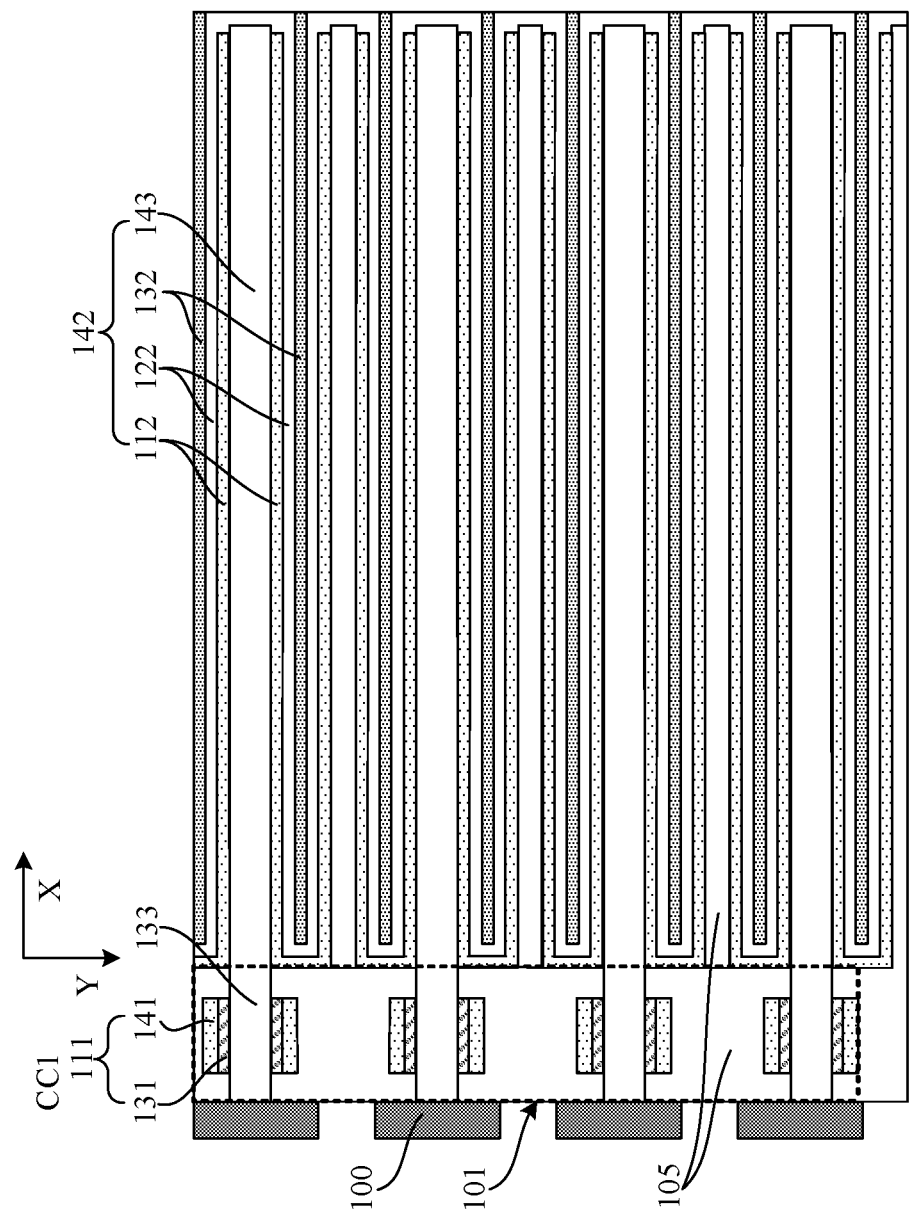
FIG. 4 is a schematic partial cross-sectional view of the semiconductor structure shown in FIG. 1 along the third cross-sectional direction at line CC1.
Figure 5:
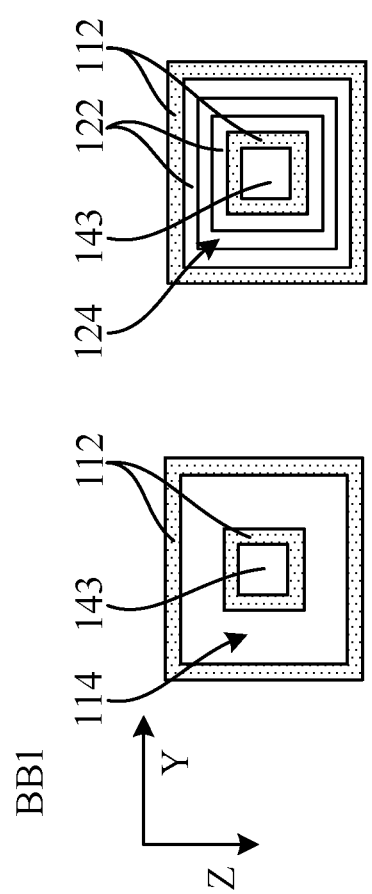
FIG. 5 is a schematic partial cross-sectional diagram of the lower electrode layer and the semiconductor layer, lower electrode layer, capacitor dielectric layer, and semiconductor layer of the semiconductor structure illustrated in FIG. 3.

An embodiment of the present disclosure provides a method for fabricating a semiconductor structure. The following will describe the method for fabricating a semiconductor structure provided by an embodiment of the present disclosure in detail with reference to the accompanying drawings. FIG. 1 is a schematic partial three-dimensional structure diagram of a semiconductor structure provided by an embodiment of the present disclosure. FIG. 2 is a partial cross-sectional schematic diagram of the semiconductor structure shown in FIG. 1 along a first cross-sectional direction at line AA1. FIG. 3 is a schematic partial cross-sectional view of the semiconductor structure shown in FIG. 1 along the second cross-sectional direction at line BB1. FIG. 4 is a partial cross-sectional schematic view of the semiconductor structure shown in FIG. 1 along the third cross-sectional direction at line CC1. FIG. 5 is a lower electrode layer in the semiconductor structure shown in FIG. 3. and partial cross-sectional schematic diagram of the semiconductor layer, the lower electrode layer, the capacitor dielectric layer and the semiconductor layer.

FIGS. 1 to 4, the semiconductor structure includes: a bit line 100, a transistor structure 101 and a capacitor structure 102 arranged in sequence along the first direction X, the capacitor structure 102 extends along the first direction X, and the transistor structures 101. Each of the capacitor structures 102 includes a part of the semiconductor layer 103, and the semiconductor layer 103 extends along the first direction X; wherein, the semiconductor layer 103 includes a capacitor region 113 facing the capacitor structure 102, and the capacitor structure 102 at least includes: sequentially surrounding the capacitor region 113, the lower electrode layer 112, the capacitor dielectric layer 122 and the upper electrode layer 132 of the sidewalls extending along the first direction X, at least part of the lower electrode layer 112 surrounds the sidewalls of the capacitor region 113 extending along the first direction X, and also surrounding the bottom of the upper electrode layer 132 and the sidewalls extending along the first direction X, the capacitor dielectric layer 122 is located between the upper electrode layer 132 and the lower electrode layer 112.

It can be understood that the upper electrode layer 132 surrounds the sidewalls of the capacitor region 113 extending along the first direction X, that is, the upper electrode layer 132 is provided on both sides of the capacitor region 113 along the direction perpendicular to the first direction X. On this basis, the lower electrode layer 112 surrounds the sidewalls and bottom of the upper electrode layer 132, so that the upper electrode layer 132 has the lower electrode layer 112 on both sides in the direction perpendicular to the first direction X, that is, in the capacitance region, either side of the two sides of the 113 along the direction perpendicular to the first direction X has two lower electrode layers 112 extending along the first direction X, and the two lower electrode layers 112 are in contact and connected to each other. In this way, it is beneficial to increase the facing area between the upper electrode layer 132 and the lower electrode layer 112 while reducing the layout length of the lower electrode layer 112 in the first direction X, thereby increasing the capacitance of the capacitor structure 102.

In an example, referring to FIG. 2 and FIG. 3, along any direction perpendicular to the first direction X, the capacitor structure 102 surrounding the sidewalls of the capacitor region 113 extending along the first direction X may sequentially include: a part of the lower electrode layer 112 extending in the first direction X, a part of the capacitor dielectric layer 122 extending along the first direction X, the upper electrode layer 132, another part of the capacitor dielectric layer 122 extending along the first direction X, and another part extending along the first direction X. The lower electrode layer 112 extends in the direction X.

It can be understood that, the upper electrode layer 132 has an inner side toward the capacitance region 113 and an outer side away from the capacitance region 113, the inner side and the outer side are both covered with the capacitance dielectric layer 122, and along the first direction X, the upper electrode layer 132 has a first end face close to the transistor structure 101, the first end face is also covered with a capacitive dielectric layer 122, and the capacitive dielectric layer 122 on the first end face connects the capacitive dielectric layers 122 on the inner side and the outer side together. The capacitor dielectric layer 122 and the capacitor region 113 are separated by a lower electrode layer 112, and the lower electrode layer 112 is also located on the side of the capacitor dielectric layer 122 away from the upper electrode layer 132, and along the first direction X, the capacitor dielectric layer 122 There is a second end surface close to the transistor structure 101, the second end surface is also covered with a lower electrode layer 112, the lower electrode layer 112 located on the second end surface will be in contact with the capacitor region 113 and located in the capacitor dielectric layer 122 away from the upper electrode. The lower electrode layers 112 on one side of the layer 132 are connected together. In this way, the inner side, outer side and the first end face of the upper electrode layer 132 are all facing the lower electrode layer 112, that is, multiple side surfaces of the upper electrode layer 132 are facing the lower electrode layer 112, which is beneficial to increase the size of the upper electrode layer 132 and the lower electrode layer 112. The facing area between the lower electrode layers 112 increases the capacitance of the capacitor structure 102.

In addition, the layout space of the capacitor structure 102 in the semiconductor structure mainly depends on the length of the lower electrode layer 112 in the first direction X. Compared with the prior art, under the condition of the same capacitance, an implementation of the present disclosure The length of the lower electrode layer 112 in the first direction X of the capacitor structure 102 improved in the example is reduced, which is beneficial to reduce the layout length of the capacitor structure 102 in the first direction X, which is beneficial to the semiconductor structure per unit area. More capacitor structures 102 are integrated to increase the integration density of the semiconductor structure.

Therefore, the semiconductor structure provided by an embodiment of the present disclosure is beneficial to improve the capacitance of the capacitor structure 102 while increasing the integration density of the semiconductor structure.

Moreover, the bit line 100, the transistor structure 101 and the capacitor structure 102 are all arranged along the first direction X, and both the transistor structure 101 and the capacitor structure 102 include a semiconductor layer 103. It can be understood that the transistor structure 101 and the capacitor structure 102 share the semiconductor layer 103, and the semiconductor layer 103 in the transistor structure 101 is electrically connected to the semiconductor layer 103 in the capacitor structure 102, thereby realizing the electrical connection between the transistor structure 101 and the capacitor structure 102, which is beneficial to construct a new layout mode among the bit line 100, the transistor structure 101 and the capacitor structure 102.

The capacitor structure 102 will be described in detail below with reference to FIGS. 2 to 5.

In some embodiments, with reference to FIGS. 2 to 5, the lower electrode layer 112 itself encloses a first annular groove 114, and the direction from the bottom of the first annular groove 114 to the notch is the first direction X; the capacitive dielectric layer 122 covers the bottom and sidewalls of the first annular groove 114, and the capacitor dielectric layer 122 itself surrounds the second annular groove 124. The direction of the bottom of the second annular groove 124 pointing to the notch is the first direction X; the upper electrode layer 132 The second annular groove 124 is filled. In this way, it is beneficial to realize that the multiple sides of the upper electrode layer 132 are all facing the lower electrode layer 112, so as to increase the facing area between the upper electrode layer 132 and the lower electrode layer 112, thereby increasing the capacitance of the capacitor structure 102.

In some embodiments, with reference to FIGS. 2 to 5, on a cross-section perpendicular to the first direction X, the cross-sectional shape of the first annular groove 114 and the cross-sectional shape of the second annular groove 124 may be square. In other embodiments, the cross-sectional shape of the first annular groove 114 and the cross-sectional shape of the second annular groove 124 may also be annular. In practical applications, the cross-sectional shape of the first annular groove 114 and the cross-sectional shape of the second annular groove 124 are not limited, and only need to be annular grooves to increase the facing area between the upper electrode layer 132 and the lower electrode layer 112.

In some embodiments, along the first direction X, with reference to FIG. 2, the capacitor region 113 has an end face away from the transistor structure 101, the capacitor dielectric layer 122 also covers the end face by the casing, and the upper electrode layer 132 can also cover the side of the capacitor dielectric layer 122 away from the end surface.

In some embodiments, the upper electrode layer 132 includes a diffusion barrier layer (not shown in the figure) and an electrical connection layer (not shown in the figure) stacked in sequence, and the diffusion barrier layer covers the capacitive dielectric layer 122 away from the lower surface of the electrode layer 112, the electrical connection layer covers the surface of the diffusion barrier layer away from the capacitor dielectric layer 122. The diffusion barrier layer is beneficial to prevent the conductive material in the electrical connection layer from diffusing into the capacitor dielectric layer 122 to ensure good insulation performance of the capacitor dielectric layer 122 and good electrical conductivity of the electrical connection layer.

In one example, the material of the diffusion barrier layer may be titanium nitride, and the material of the electrical connection layer and the material of the lower electrode layer 112 may be at least one of conductive materials such as titanium nitride, polysilicon, tungsten, or copper. Alternatively, the material of the capacitor dielectric layer 122 may be a high dielectric constant dielectric material such as strontium titanate, hafnium oxide, chromium oxide, or zirconium oxide.

In some embodiments, the plurality of bit lines 100, the plurality of transistor structures 101 and the plurality of capacitor structures 102 are arranged along the second direction Y, and the bit lines 100 correspond to the transistor structures 101 one-to-one, and the transistor structures 101 Corresponding one-to-one with the capacitor structures 102, each of the plurality of transistor structures 101 includes a part of the gate structure 111, and the gate structure 111 extends along the second direction Y, and the first direction X and the second direction Y intersect.

It can be understood that the gate structure 111 is used to control the transistor structure 101, and the plurality of transistor structures 101 all include part of the gate structure 111, then a gate structure 111 can be controlled to be arranged along the second direction Y. The multiple transistor structures 101 in the semiconductor structure are thus beneficial to improve the integration density of the transistor structures 101, the bit lines 100 and the capacitor structures 102 in the semiconductor structure, and at the same time reduce the complexity of controlling multiple devices in the semiconductor structure.

It should be noted that, in FIGS. 1 to 4, the semiconductor structure includes four bit lines 100 arranged along the second direction Y as an example. In practical applications, the number of bit lines 100 included in the semiconductor structure is not specified. As a limitation, it only needs to satisfy that the number of bit lines 100 is equal to the number of transistor structures 101.

In some embodiments, referring to FIGS. 1 to 4, the transistor structure 101 may include a plurality of sub-transistor structures 121 spaced along the third direction 7., and the capacitor structure 102 may include a plurality of sub-transistor structures 121 spaced along the third direction 7. There are sub-capacitor structures 142, the semiconductor layer 103 includes a plurality of sub-semiconductor layers 123 spaced along the third direction 7, the sub-transistor structures 121 correspond to the sub-capacitor structures 142 one-to-one, and the sub-transistor structures 121 correspond to the corresponding sub-capacitor structures 142 each includes a sub-semiconductor layer 123; and the bit line 100 extends along the third direction 7, and the bit line 100 is electrically connected to a plurality of sub-transistor structures 121 in the same transistor structure 101.

Herein, every two of the first direction X, the second direction Y and the third direction 7. intersect. In one example, every two of the first direction X, the second direction Y and the third direction Z are perpendicular to each other.

It can be understood that, a plurality of sub-transistor structures 121 and a plurality of sub-capacitor structures 142 can be arranged along the third direction Z, a sub-transistor structure 121 can be independently used as a transistor unit, and a sub-capacitor structure 142 can be independently used as a capacitor unit, one transistor unit and one capacitor unit can form a memory unit, thus, it is beneficial to increase the layout density of the memory unit in the semiconductor structure by stacking the sub-transistor structure 121 and the sub-capacitor structure 142 along the third direction Z, thereby improving the integration of the semiconductor structure density.

It should be noted that in FIGS. 2 to 4, the number of the sub-transistor structures 121 stacked along the third direction Z in a transistor structure 101 is taken as an example. In practical applications, for a transistor structure 101. The number of the sub-transistor structures 121 stacked on the third direction Z in the middle is not limited, and can be designed according to actual needs, as long as the number of the sub-transistor structures 121, the number of the sub-capacitor structures 142 and the sub-semiconductor layers 123 are the same.

In an example, the number of the sub-transistor structures 121 stacked along the third direction 7. in a transistor structure 101 may be one, then the sub-transistor structure 121 is the transistor structure 101, and a capacitor structure 102 in the middle. The number of the sub-capacitor structures 142 stacked in the third direction 7 is one, then the sub-capacitor structure 142 is the capacitor structure 102, and the number of the sub-semiconductor layers 123 stacked along the third direction 7. in a semiconductor layer 103 is one The sub-semiconductor layer 123 is the semiconductor layer 103.

It should be noted that, in FIG. 2 to FIG. 4, along the third direction Z, in the sub-capacitor structure 142 located on the topmost layer, the lower electrode layer 112 and the capacitor dielectric layer 122 located on the top surface of the sub-semiconductor layer 123. The upper electrode layer 132 and the upper electrode layer 132 may be only one layer, that is, the upper electrode layer 132 located on the top surface may not be covered by the capacitor dielectric layer 122 and the lower electrode layer 112, so that the subsequent conductive layer can pass through the exposed upper electrode layer 132. The electrical signal is transmitted to the upper electrode layer 132 or the electrical signal in the upper electrode layer 132 is transferred to other electrical devices. In practical applications, along the third direction Z, in the sub-capacitor structure 142 located at the topmost layer, the lower electrode layer 112, the capacitor dielectric layer 122, the upper electrode layer 132, the capacitor layer 132, the capacitor layer 123 can also be stacked on the top surface of the sub-semiconductor layer 123 in sequence. The dielectric layer 122 and the lower electrode layer 112 and subsequent conductive layers can transmit electrical signals to the upper electrode layer 132 through other exposed areas of the upper electrode layer 132 or transmit electrical signals in the upper electrode layer 132 to other electrical devices.

In some embodiments, referring to FIGS. 2 to 4, along the first direction X, the bit line 100 may include opposite first and second sides 110 and 120, the first and second sides 110 and 120 being different transistor structures 101 are electrically connected. In this way, the two transistor structures 101 share the bit line 100, which is beneficial to further improve the integration density of the transistor structure 101, the bit line 100 and the capacitor structure 102 in the semiconductor structure, and further reduce the complexity of the control of multiple devices in the semiconductor structure.

It should be noted that FIG. 2 only illustrates the transistor structure 101 electrically connected to the second side 120. In practical applications, the first side 110 may also be electrically connected to another transistor structure 101.

In some embodiments, with continued reference to FIGS. 2 to 4, along the first direction X, the sub-semiconductor layer 123 may include a first region 133 and a sub-capacitor region 143, and the first region 133 is far from the sub-capacitor region 143. The end face is in contact with the bit line 100; the sub-transistor structure 121 may include a first region 133 and a gate structure 111, the gate structure 111 surrounds part of the sidewalls of the first region 133 extending along the first direction X; the sub-capacitor structure 142 includes a sub-capacitor structure 143, and the lower electrode layer 112 that is stacked in sequence, part of the capacitor dielectric layer 122 and part of the upper electrode layer 132, the sidewalls of the lower electrode layer 112 which surround of the sub-capacitor region 143 and extend along the first direction X, wherein the lower electrode layer 112 corresponds in one-to-one relationship with the sub-capacitor regions 143.

It can be understood that the capacitor region 113 includes a plurality of sub-capacitor regions 143 that are spaced along the third direction Z.

In some embodiments, referring to FIGS. 2 and 4, the first region 133 in the transistor structure 101 includes sequentially along the first direction X: a second region in contact with the bit line 100, and the channel region facing the gate structure 111 and the third region in contact with the capacitor region 113, wherein the second region can be one of the source electrode or the drain electrode in the transistor structure 101, and the third region can be another one of the source electrode or the drain electrode, wherein, the third region is in contact with the capacitor region 113, so to realize the electrical connection between the transistor structure 101 and the capacitor structure 102. Specifically, the third region is in contact with the sub-capacitor region 143 to realize electrical connection between the sub-transistor structure 121 and the sub-capacitor structure 142.

It should be noted that the plane perpendicular to the third direction Z is the reference plane, and the gate structure 111 is directly opposite the channel region means: the orthographic projection of the gate structure 111 on the reference plane coincides the orthographic projection of the channel region on the reference plane.

Continue to refer to FIGS. 2 and 4, the gate structure 111 may include a gate dielectric layer 131 and a gate conductive layer 141, wherein the gate dielectric layer 131 extends along the first direction X around the channel region. The sidewall, the gate conductive layer 141 surrounds the sidewalls of the gate dielectric layer 131 away from the channel region and extends along the first direction X, and the gate conductive layer 141 extends along the second direction Y, so that a gate conductive layer 141 connects the gate dielectric layers 131 of the plurality of sub-transistor structures 121 which are arranged at intervals along the second direction Y. It can be understood that the material of the gate conductive layer 141 may be at least one of conductive materials such as titanium nitride, tungsten, or silver, and the material of the gate dielectric layer 131 may be at least one of the insulating materials such as silicon oxide, silicon nitride, or silicon oxynitride.

In some embodiments, the semiconductor structure may further include: a dielectric layer 105, the dielectric layer 105 includes a plurality of regions, and a part of the dielectric layer 105 is located between the bit line 100 and the transistor structure 101, so as to realize the bit line 100 and the transistor structure 101; part of the dielectric layer 105 is located between the transistor structure 101 and the capacitor structure 102 to achieve electrical isolation between the transistor structure 101 and the capacitor structure 102; part of the dielectric layer 105 is located along the second direction Y and/or Between adjacent sub-transistor structures 121 along the third direction Z, to achieve electrical isolation between adjacent sub-transistor structures 121; part of the dielectric layer 105 is located along the second direction Y and/or along the third direction Z adjacent to between the sub-capacitor structures 142 to achieve electrical isolation between adjacent sub-capacitor structures 142.

It should be noted that, an embodiment of the present disclosure does not limit whether the dielectric layer 105 is a single-layer structure or a laminated structure, and in practical applications, it can be set according to actual needs. In some embodiments, the material of the dielectric layer 105 may include at least one of insulating materials such as silicon oxide, silicon nitride, or silicon oxynitride.

In some embodiments, referring to FIGS. 2 and 4, the length of the lower electrode layer 112 in the first direction X is smaller than the length of the sub-capacitor region 143 in the first direction X. In practical applications, the length of the lower electrode layer 112 in the first direction X may also be equal to the length of the sub-capacitor region 143 in the first direction X.

In some embodiments, referring to FIG. 2, a plurality of sub-capacitor structures 142 in the same capacitor structure 102 and spaced along the third direction Z share the capacitor dielectric layer 122. In this way, it is beneficial to simplify the process steps of preparing the capacitor dielectric layer 122.

In some embodiments, with continued reference to FIG. 2, a plurality of sub-capacitor structures 140 in the same capacitor structure 102 and spaced along the third direction Z share the upper electrode layer 132. In this way, it is beneficial to simplify the process steps of preparing the upper electrode layer 132.

The specific conditions of the lower electrode layer 112, the capacitor dielectric layer 122 and the upper electrode layer 132 will be described in detail below through three specific embodiments.

In an example, a plurality of sub-capacitor structures 142 in the same capacitor structure 102 arranged at intervals along the third direction 7 may only share the capacitor dielectric layer 122, and the upper electrode layers 132 in different sub-capacitor structures 142 do not. They are connected to each other, that is, different sub-capacitor structures 142 have different upper electrode layers 132. Specifically, the dielectric layer 105 located between adjacent sub-capacitor structures 142 has a third end surface away from the transistor structure 101, the upper electrode layer 132 is not located on the third end surface, and the capacitor dielectric layer 122 is located in the sub-capacitor region 143 away from the third end surface. The end surface of the first region 133 and the end surface of the dielectric layer 105 away from the transistor structure 101 are located, so as to realize that a plurality of sub-capacitor structures 142 in the same capacitor structure 102 arranged at intervals along the third direction 7 share the capacitor dielectric layer 122 without The upper electrode layer 132 is shared.

In another example, a plurality of sub-capacitor structures 142 in the same capacitor structure 102 arranged at intervals along the third direction Z may only share the upper electrode layer 132, and the capacitor dielectric layers 122 in different sub-capacitor structures 142 are not connected to each other, that is, different sub-capacitor structures 142 have different capacitor dielectric layers 122. Specifically, the length of the lower electrode layer 112 in the first direction X is smaller than the length of the sub-capacitor regions 143 in the first direction X, and the length of the lower electrode layer 112 in the first direction X is smaller than that of the adjacent sub-capacitor structures 142. The length of the dielectric layer 105 between them in the first direction X, the capacitor dielectric layer 122 only covers the sidewalls of the remaining sub-capacitor regions 143 extending along the first direction X and only covers the remaining dielectric layers 105 extending along the first direction X. The sidewalls are not located on the end face of the sub-capacitor region 143 far away from the first region 133 and not on the end face of the dielectric layer 105 far away from the transistor structure 101, while the upper electrode layer 132 covers the end face of the sub-capacitor region 143 away from the first region 133 and the dielectric layer 105. The end faces of the transistor structure 101 are far away from each other, so as to realize that the plurality of sub-capacitor structures 142 in the same capacitor structure 102 arranged at intervals along the third direction Z share the upper electrode layer 132 instead of the capacitor dielectric layer 122.

In yet another example, along the first direction X, referring to FIG. 2, the capacitor dielectric layer 122 is located on the end surface of the sub-capacitor region 143 away from the first region 133 and the end surface of the dielectric layer 105 away from the transistor structure 101, and the upper electrode layer 132 covers all the exposed surfaces of the capacitor dielectric layer 122, so as to realize that the plurality of sub-capacitor structures 142 in the same capacitor structure 102 arranged at intervals along the third direction Z share the upper electrode layer 132 and the capacitor dielectric layer 122.

It should be noted that, in practical applications, a plurality of sub-capacitor structures 142 arranged at intervals along the third direction Z in the same capacitor structure 102 may also share the upper electrode layer 132.

In summary, the upper electrode layer 132 surrounds the sidewalls of the capacitor region 113 extending along the first direction X, that is, the upper electrode layer 132 is provided on both sides of the capacitor region 113 along the direction perpendicular to the first direction X, on this basis, the lower electrode layer 112 surrounds the sidewalls and bottom of the upper electrode layer 132, so that the upper electrode layer 132 has the lower electrode layer 112 on both sides in the direction perpendicular to the first direction X, that is, in the capacitance region Either side of the two sides of the 113 along the direction perpendicular to the first direction X has two lower electrode layers 112 extending along the first direction X, and the two lower electrode layers 112 are in contact and connected to each other. In this way, there are It is beneficial to increase the facing area between the upper electrode layer 132 and the lower electrode layer 112 while reducing the layout length of the lower electrode layer 112 in the first direction X to improve the integration density of the semiconductor structure, thereby increasing the capacitance structure 102 of electric capacity.

Another embodiment of the present disclosure also provides a method for fabricating a semiconductor structure for preparing the semiconductor structure provided in the foregoing embodiments. A method for manufacturing a semiconductor structure provided by another embodiment of the present disclosure will be described in detail below with reference to FIGS. 1 to 14. FIGS. 6 to 14 are partial cross-sectional schematic diagrams corresponding to each major step of a method for fabricating a semiconductor structure according to another embodiment of the present disclosure. It should be noted that, the parts that are the same as or corresponding to the foregoing embodiments will not be repeated here.

It should be noted that FIG. 2 is a schematic partial cross-sectional view of the semiconductor structure shown in FIG. 1 along the first cross-sectional direction at line AA1; FIG. 3 is a schematic partial cross-sectional view of the semiconductor structure shown in FIG. 1 along the second cross-sectional direction at line BB1. FIG. 4 is a schematic partial cross-sectional view of the semiconductor structure shown in FIG. 1 along the third cross-sectional direction at line CC1. The cross-sectional schematic diagram along the first cross-sectional direction at line AA1 and the second cross-sectional direction at line BB1 will be set later according to the needs of the expression. Any one, two, or three of the schematic cross-sectional views or a partial cross-sectional schematic views will be used along the first cross-sectional direction at line AA1, along the second cross-sectional direction at line BB1 or the third cross-sectional direction at line CC1.

Referring to FIGS. 6 to 14, a method of fabricating a semiconductor structure includes: forming a bit line 100, a transistor structure 101 and a capacitor structure 102 arranged in sequence along a first direction X, the capacitor structure 102 extending along the first direction X, and both the transistor structure 101 and the capacitor structure 102 include a semiconductor layer 103, and the semiconductor layer 103 extends along the first direction X; wherein, the semiconductor layer 103 includes a capacitor region 113 facing the capacitor structure 102, and the capacitor structure 102 at least includes: sequentially surrounding the capacitor. The lower electrode layer 112, the capacitor dielectric layer 122 and the upper electrode layer 132 of the sidewalls of the region 113 extending along the first direction X, at least part of the lower electrode layer 112 while surrounding the sidewalls of the capacitor region 113 extending along the first direction X, and also surround the bottom of the upper electrode layer 132 and the sidewalls extending along the first direction X, and the capacitor dielectric layer 122 is located between the upper electrode layer 132 and the lower electrode layer 112.

Figure 6:
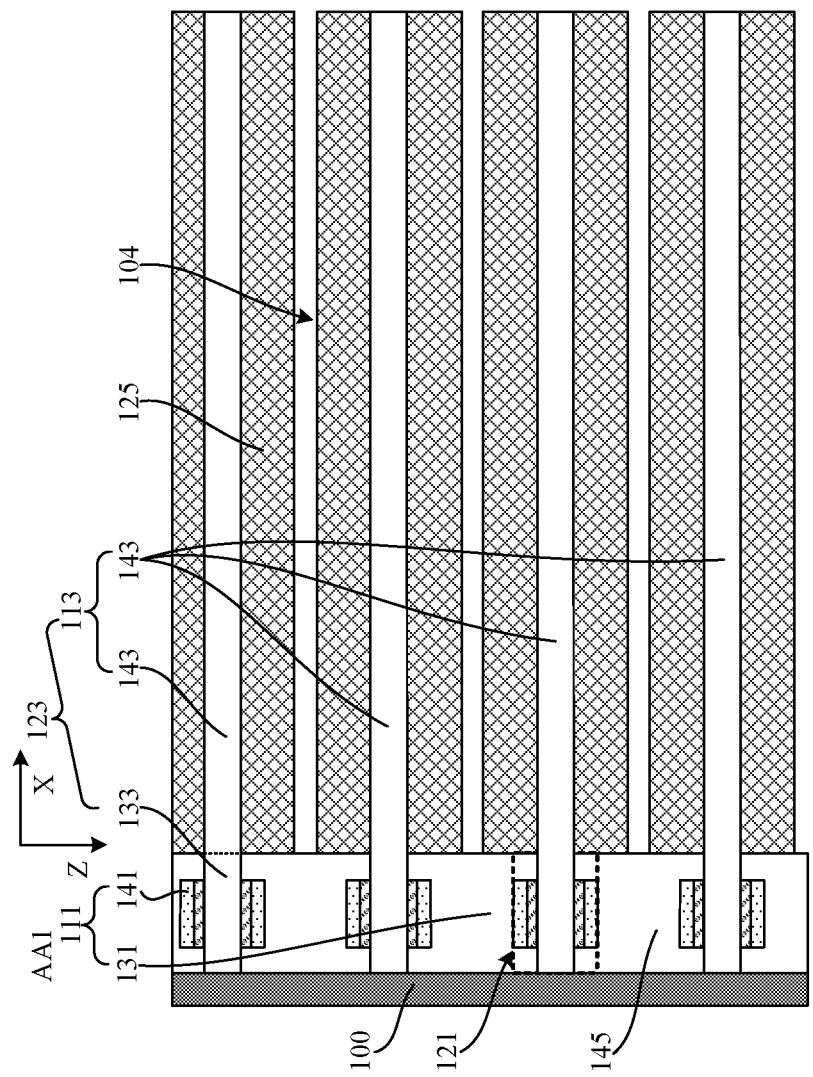
FIGS. 6 to 14 are schematic partial cross-sectional diagrams corresponding to each major step of a method for manufacturing a semiconductor structure provided by another embodiment of the present disclosure.
Figure 7:
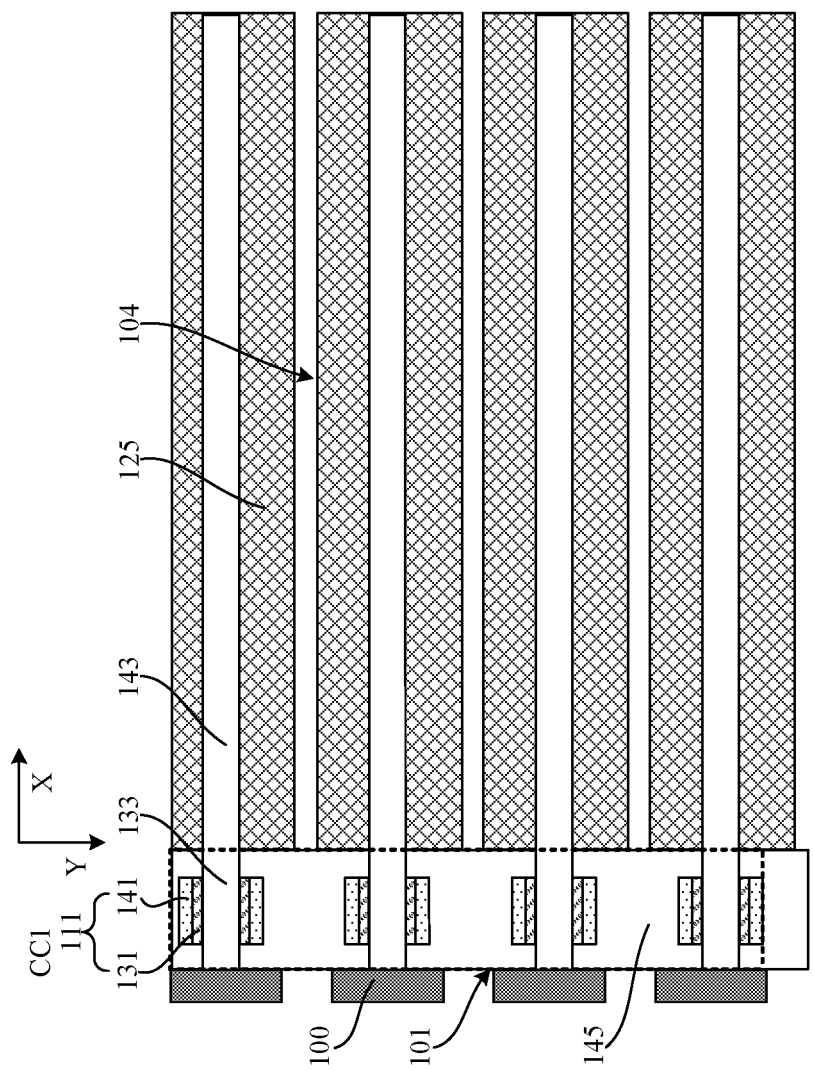

In some embodiments, referring to FIGS. 6 and 7, the step of forming the bit line 100 and the transistor structure 101 may include: along the second direction Y, forming a plurality of spaced bit lines 100 and a plurality of spacers The transistor structures 101 are arranged, and the bit lines 100 are in one-to-one correspondence with the transistor structures 101. The plurality of transistor structures 101 each include a portion of the gate structure 111. The gate structure 111 extends along the second direction Y, the first direction X and the second direction Y intersect.

Referring to FIGS. 6 and 7, the step of forming the bit line 100 and the transistor structure 101 may further include: along the third direction Z, forming a plurality of spaced sub-transistor structures 121, and a plurality of sub-semiconductor layers 123 arranged at intervals, wherein at least part of the sub-transistor structures 121 arranged along the third direction Z constitute the transistor structure 101, and at least part of the sub-semiconductor layers 123 arranged along the third direction Z constitute a semiconductor layer 103.

In this way, it is beneficial to form the sub-transistor structure 121 and the sub-semiconductor layer 123 arranged at intervals along the second direction X and/or the third direction Y, which further facilitates the subsequent formation of the second direction X and/or the third direction Y. The sub-capacitor structures are arranged at intervals to improve the integration density of the transistor structures 101, the bit lines 100 and the sub-capacitor structures in the semiconductor structure.

It should be noted that, another embodiment of the present disclosure does not limit the specific formation method and formation sequence of the bit line 100, the sub-transistor structure 121, and the sub-semiconductor layer 123. In addition, for the details of the bit line 100, the sub-transistor structure 121 and the sub-semiconductor layer 123, please refer to the foregoing embodiments, which will not be repeated here.

In some embodiments, continue to refer to FIGS. 6 and 7, in the step of forming the transistor structure 101, it may further include: forming a third dielectric layer 145, the third dielectric layer 145 being located along the second direction Y and/or or between adjacent sub-transistor structures 121 along the third direction Z.

In some embodiments, referring to FIGS. 6 to 14, along the first direction X, the sub-semiconductor layer 123 may include a first region 133 and a sub-capacitor region 143, and the first region 133 is directly opposite to the sub-transistor structure 121; Forming the sub-capacitor structure 142 may include the following steps.

Referring to FIGS. 6 to 11, a first dielectric layer 115 is formed, the first dielectric layer 115 is located between adjacent sub-capacitor regions 143, and there is a third annular groove 134 between the first dielectric layer 115 and the sub-capacitor regions 143, the direction from the bottom of the third annular groove 134 to the notch is the first direction X, and the third annular groove 134 is in one-to-one correspondence to the sub-capacitor regions 143. The third annular groove 134 is used to subsequently form the lower electrode layer 112, the capacitor dielectric layer 122 and the upper electrode layer 132 that surround the sidewalls of the sub-capacitor region 143 and extend in the first direction X in turn. It can be understood that due to the need in the formed capacitor structure 102, at least part of the lower electrode layer 112 surrounds the sidewalls of the capacitor region 113 extending along the first direction X, and also surrounds the bottom of the upper electrode layer 132 and the sidewalls extending along the first direction X. The capacitor dielectric layer 122 is located between the upper electrode layer 132 and the lower electrode layer 112. At this time, along the direction perpendicular to the first direction X. The distance between the sidewalls of the third annular groove 134 and the sub-capacitor region 143 is greater than or equal to the sum of twice the thickness of the lower electrode layer 112, twice the thickness of the capacitor dielectric layer 122 and the thickness of the upper electrode layer 132 in subsequent designs.

In practical application, according to the designed thickness of the lower electrode layer 112, the capacitor dielectric layer 122 and the upper electrode layer 132 in the direction perpendicular to the first direction X, the distance between the sidewalls of the third annular groove 134 and the sub-capacitors 143 can be designed.

Figure 11:
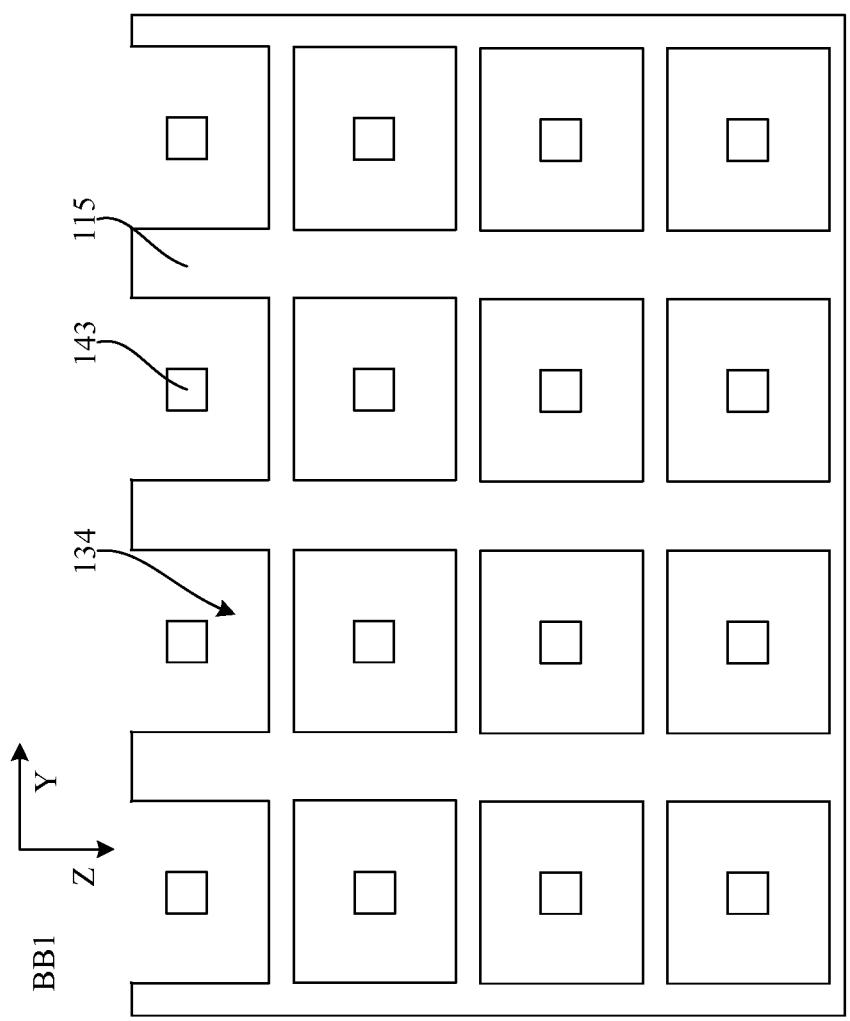

In some embodiments, referring to FIG. 11, along a cross-section perpendicular to the first direction X, the cross-sectional shape of the third annular groove 134 may be a square. In other embodiments, the cross-sectional shape of the third annular groove 134 may also be an annular shape. In practical applications, the cross-sectional shape of the third annular groove 134 is not limited, and only the distance between the sidewalls of the third annular groove 134 and the sub-capacitor region 143 and the distance between the lower electrode layer 112, the capacitor dielectric layer 122 and the upper The relationship between the thicknesses of the electrode layers 132 is sufficient.

In some embodiments, the step of forming the first dielectric layer 115 and the third annular groove 134 may include: referring to FIGS. 6 and 7, forming a second dielectric layer 125, the second dielectric layer 125 being located in the sub-capacitor region 143. The sidewalls extending along the first direction X have a space 104 between adjacent second dielectric layers 125; with reference to FIGS. 8 to 9, a first dielectric layer 115 is formed, the first dielectric layer 115 is located in the space 104, and the first dielectric layer 115 exposes a part of the second dielectric layer 125; with reference to FIGS. 9 to 11, the second dielectric layer 125 is removed by using the first dielectric layer 115 as a mask to form the third annular groove 134.

It can be understood that, under the same etching conditions, the etching selection between the material of the first dielectric layer 115 and the material of the second dielectric layer 125 is relatively large. In one example, the material of the first dielectric layer 115 may be silicon nitride, and the material of the second dielectric layer 125 may be silicon oxide.

It should be noted that, in FIGS. 8 to 11, along the third direction Z, the first dielectric layer 115 formed does not cover the top surface of the second dielectric layer 125 located at the topmost layer, so that the topmost layer is located at the topmost layer. The top surface of the sub-capacitor region 143 does not have the spacer 104 as an example. In practical applications, the first dielectric layer 115 formed can also cover the top surface of the second dielectric layer 125 located on the topmost layer, so that the sub-capacitors located on the topmost layer. There is also a gap 104 between the top surface of the region 143 and the first dielectric layer 115, and the sub-capacitor region 143 on the topmost layer can also form a part of the lower electrode layer 112 that is sequentially stacked along the third direction Z and extends along the first direction X., a part of the capacitor dielectric layer 122 extending along the first direction X, the upper electrode layer 132, another part of the capacitor dielectric layer 122 extending along the first direction X, and another part of the lower electrode layer 112 extending along the first direction X.

Figure 9:
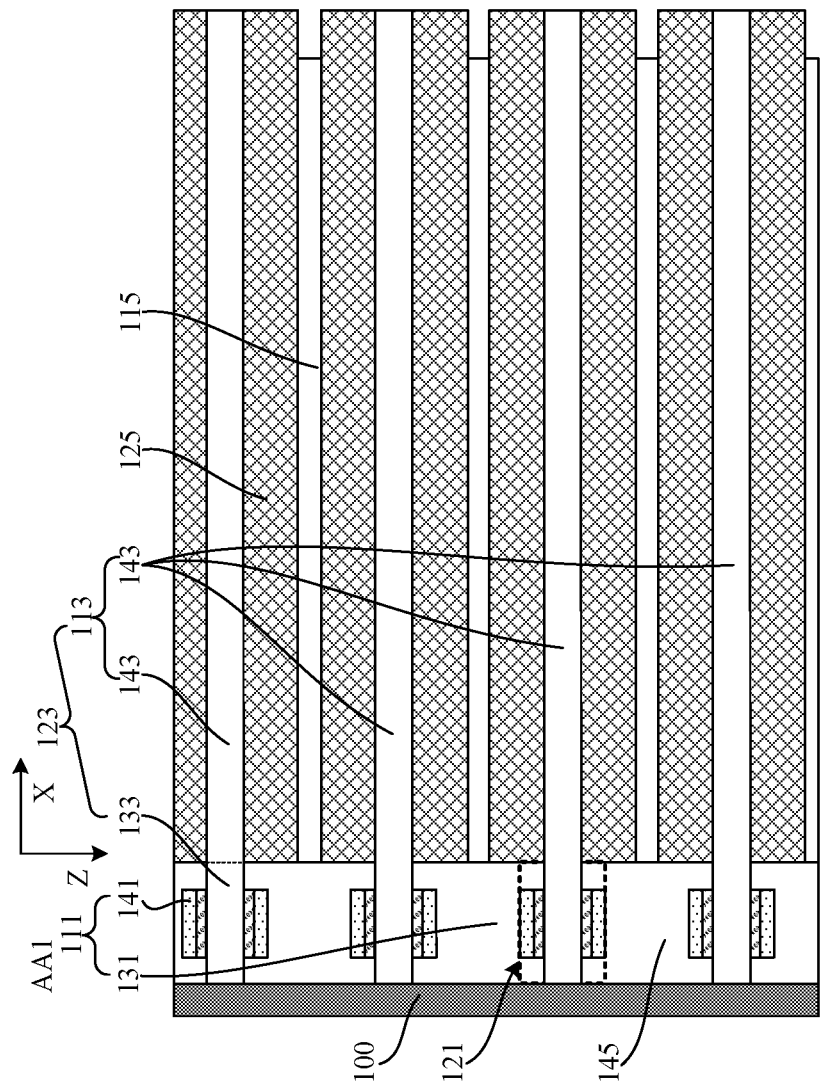
Figure 10:
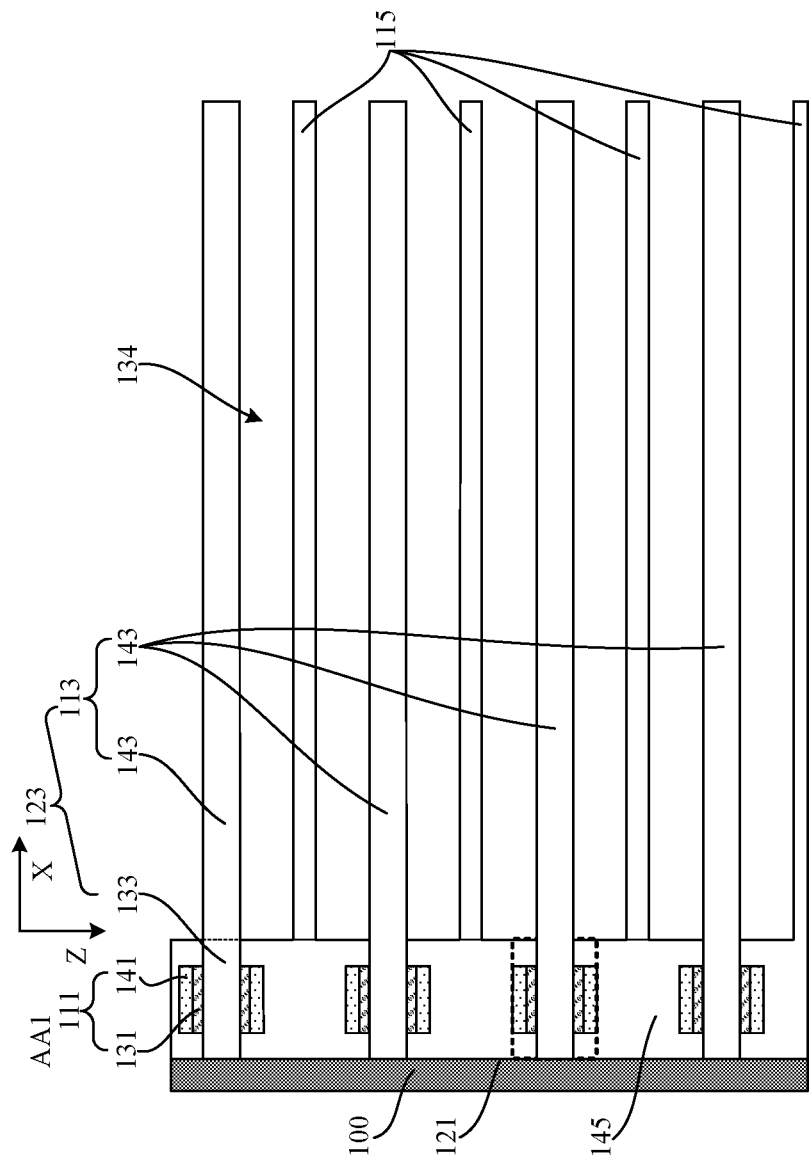

It should be noted that, in FIG. 9, the first dielectric layer 115 fills most of the area of the spacer 104 as an example. In practical applications, the first dielectric layer 115 can also fill the space 104 and expose the second dielectric layer 125. That is, the end surface of the first dielectric layer 115 away from the sub-transistor structure 121 is flush with the end surface of the second dielectric layer 125 away from the sub-transistor structure 121 to expose the end surface of the second dielectric layer 125 away from the sub-transistor structure 121.

Figure 8:
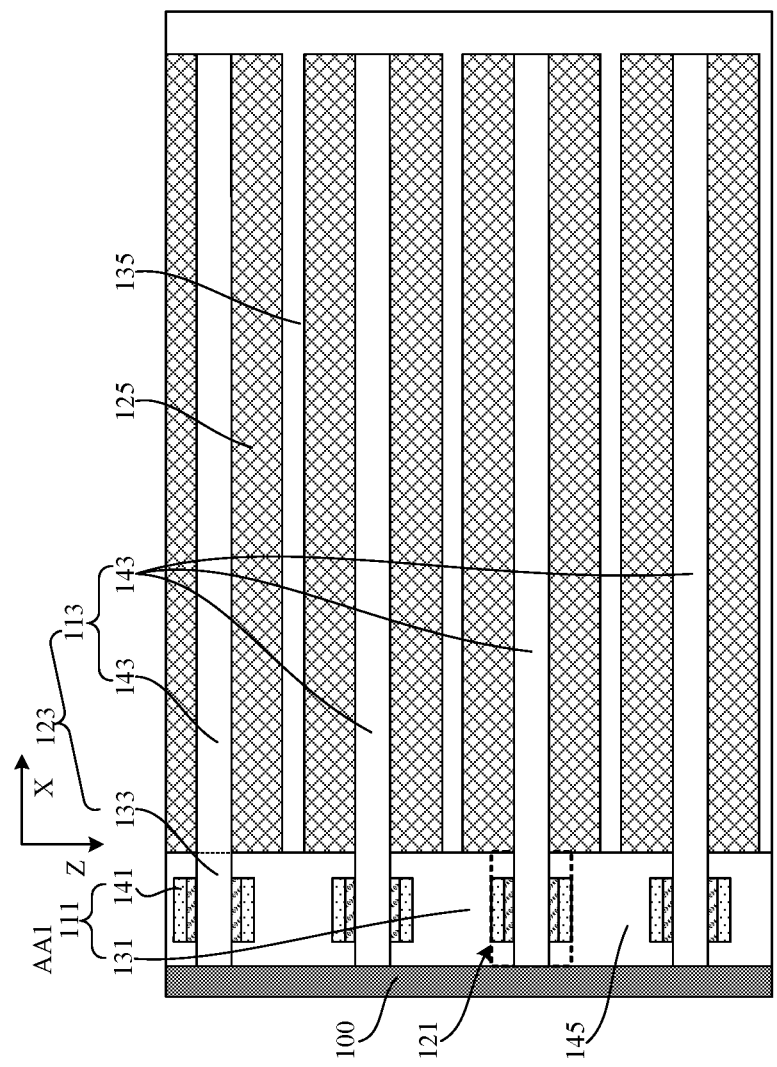

In some embodiments, the step of forming the first dielectric layer 115 may further include: with reference to FIGS. 7 and 8, forming an initial first dielectric layer 135, the initial first dielectric layer 135 fills the space 104, and the initial first dielectric layer 135 The first dielectric layer 135 covers the end face of the second dielectric layer 125 away from the first region 133; with reference to FIGS. 8 and 9, the initial first dielectric layer 135 is etched to expose at least the second dielectric layer 125 away from the first region 133 On the end face, the initial first dielectric layer 135 remains as the first dielectric layer 115.

It can be understood that, because the distance between the bottom surface of the spacer 104 and the opening is large, that is, the length of the spacer 104 in the first direction X is large, and the depth-to-width ratio of the spacer 104 is large. When it is necessary to form the first dielectric layer 115 filling most areas of the spacers 104, due to the large aspect ratio of the spacers 104, the material used to form the first dielectric layer 115 easily covers the second dielectric layer 125 away from the first region 133. The end face of the second dielectric layer 125 and the end face covering the second dielectric layer 125 away from the first region 133, therefore, the initial first dielectric layer 135 filled with the space 104 is formed first, and then the initial first dielectric layer 135 is etched, which is conducive to the formation of satisfactory The first dielectric layer 115 is formed, thereby facilitating the subsequent formation of the third annular groove 134 based on the first dielectric layer 115 and the second dielectric layer 125.

Figure 12:
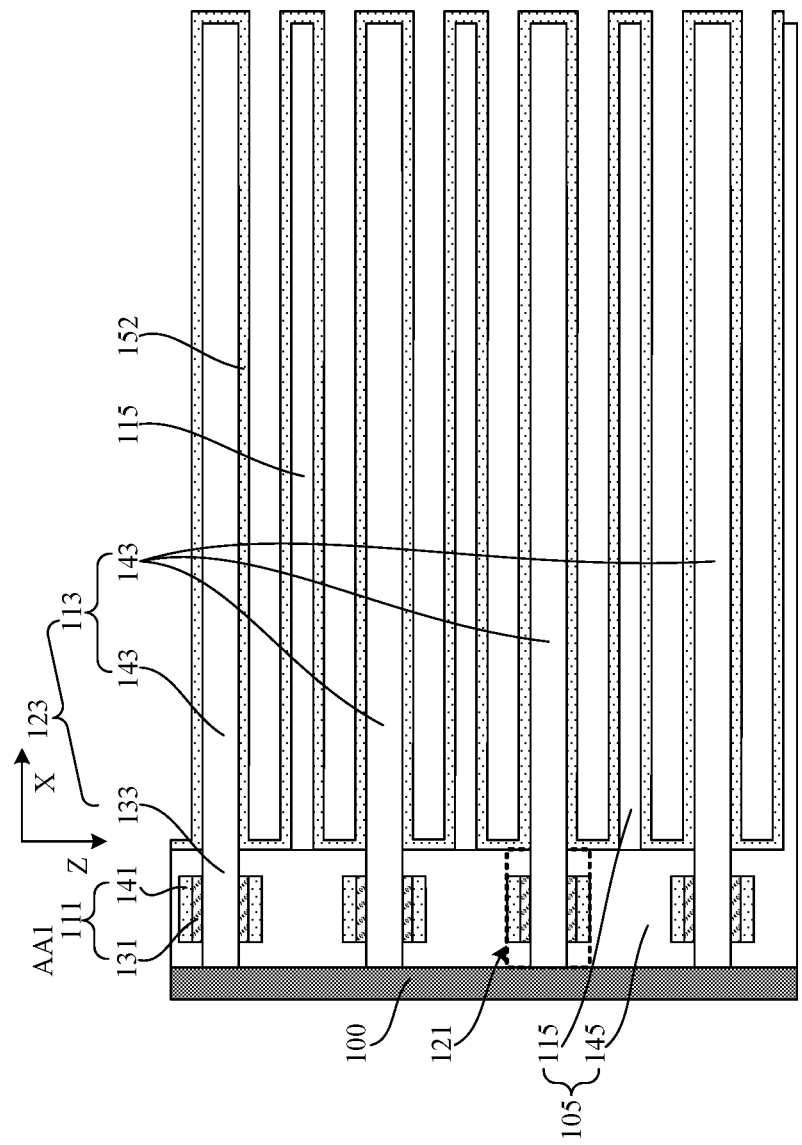
Figure 13:
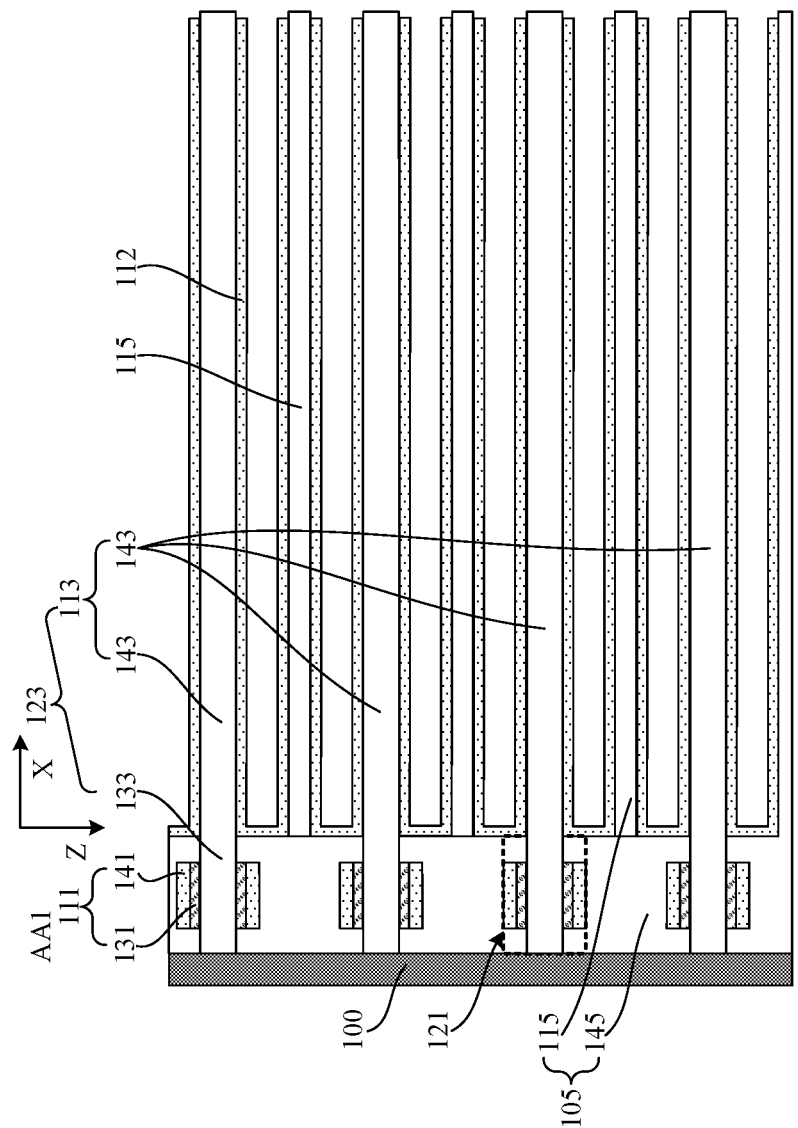
Figure 14:
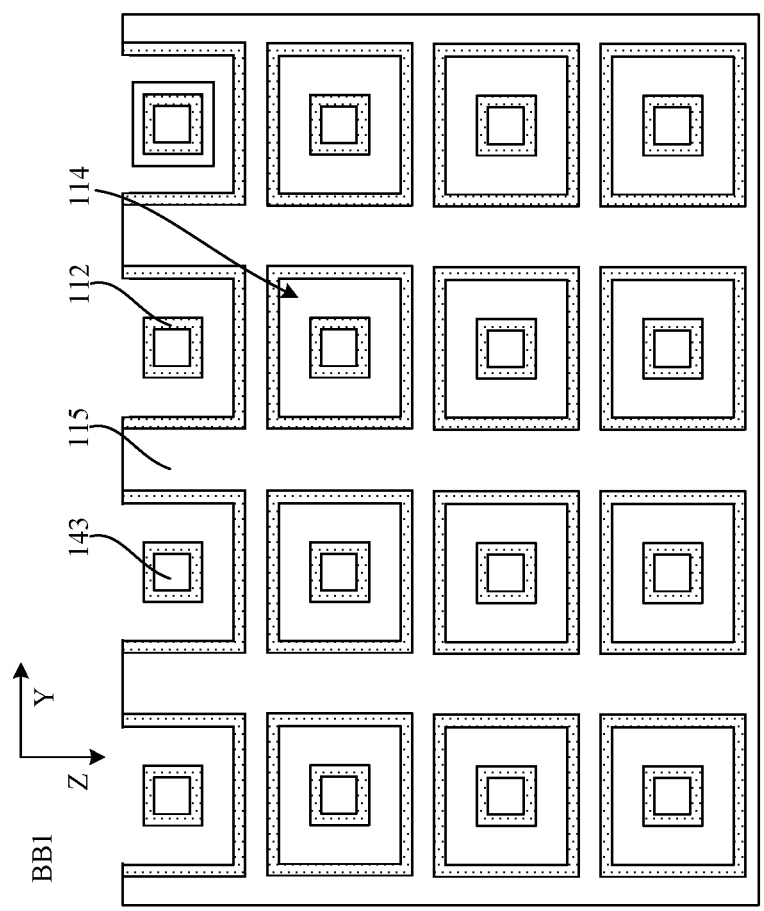

Referring to FIGS. 12 to 14, the lower electrode layer 112 is formed, the lower electrode layer 112 covers the bottom and sidewalls of the third annular groove 134, and the lower electrode layer 112 itself surrounds the first annular groove 114 and the first annular groove. The direction of the bottom of 114 pointing to the notch is the first direction X, and the lower electrode layer 112 has one-to-one correspondence to the sub-capacitor regions 143.

It should be noted that, in FIGS. 8 to 14, along the third direction Z, the first dielectric layer 115 formed does not cover the top surface of the second dielectric layer 125 located at the topmost layer, so that the topmost layer is located at the topmost layer. The top surface of the sub-capacitor region 143 does not have the spacer 104 as an example. In practical applications, the first dielectric layer 115 formed can also cover the top surface of the second dielectric layer 125 located on the topmost layer, so that the sub-capacitors located on the topmost layer. There is also a gap 104 between the top surface of the region 143 and the first dielectric layer 115, and the sub-capacitor region 143 on the topmost layer can also form a part of the lower electrode layer 112 that is sequentially stacked along the third direction Z and extends along the first direction X, a part of the capacitor dielectric layer 122 extending along the first direction X, the upper electrode layer 132, another part of the capacitor dielectric layer 122 extending along the first direction X, and another part of the lower electrode layer 112 extending along the first direction X.

In some embodiments, the step of forming the lower electrode layer 112 may include: referring to FIG. 12, forming an initial lower electrode layer 152, the initial lower electrode layer 152 conformally covering the first dielectric layer 115 exposed by the third annular groove 134. Referring to FIGS. 12 and 13, the initial lower electrode layer 152 is etched to remove the initial lower electrode layer 152 on the end face of the sub-capacitor region 143 away from the first region 133, and the remaining initial lower electrode layer 152 serves as the lower electrode layer 112.

It can be understood that, because the distance between the bottom surface of the third annular groove 134 and the opening is larger, that is, the length of the third annular groove 134 in the first direction X is larger, the depth and width of the third annular groove 134 bigger. When the lower electrode layer 112 covering the bottom and sidewalls of the third annular groove 134 needs to be formed, due to the large aspect ratio of the third annular groove 134, the material used to form the lower electrode layer 112 can easily cover the first dielectric layer 115. The end face away from the first region 133 and the end face of the sub-capacitor region 143 away from the first region 133 are covered. Therefore, an initial lower electrode that conformally covers the surface of the first dielectric layer 115 exposed by the third annular groove 134 and the surface of the sub-capacitor region 143 is formed first layer 152, and then the initial lower electrode layer 152 is etched, which is beneficial to form the lower electrode layer 112 that meets the requirements, thereby facilitating the subsequent formation of the capacitor dielectric layer 122 and the upper electrode layer 132 based on the lower electrode layer 112.

Referring to FIGS. 2 to 5, a capacitor dielectric layer 122 is formed, the capacitor dielectric layer 122 at least covers the bottom and sidewalls of the first annular groove 114, and the capacitor dielectric layer 122 itself surrounds the second annular groove 124, the direction in which the bottom of the second annular groove 124 points to the notch is the first direction X.

Continuing to refer to FIGS. 2 to 5, the upper electrode layer 132 is formed, and the upper electrode layer 132 at least fills the second annular groove 124. The sub-capacitor region 143, the lower electrode layer 112, part of the capacitor dielectric layer 122 and part of the upper electrode layer 132 constitute the sub-capacitor structure 142.

It should be noted that, for the specific description among the lower electrode layer 112, the capacitor dielectric layer 122 and the upper electrode layer 132, please refer to the foregoing embodiments, which will not be repeated here. In addition, the first dielectric layer 115 and the third dielectric layer 145 together constitute the dielectric layer 105.

To sum up, in the semiconductor structure formed by using the improved manufacturing method according to another embodiment of the present disclosure, the upper electrode layer 132 surrounds the sidewalls of the capacitor region 113 extending along the first direction X, that is, the capacitor region 113 extends along the vertical direction There are upper electrode layers 132 on both sides in the direction of the first direction X. On this basis, the lower electrode layer 112 surrounds the sidewalls and the bottom of the upper electrode layer 132, so that the upper electrode layer 132 is perpendicular to the first direction X. Both sides in the direction of X have lower electrode layers 112, that is, either side of the capacitor region 113 along the direction perpendicular to the first direction X has two lower electrode layers extending along the first direction X 112, and the two lower electrode layers 112 are in contact and connected to each other, so it is beneficial to reduce the layout length of the lower electrode layer 112 in the first direction X to improve the integration density of the semiconductor structure, while increasing the size of the upper electrode layers 132 and 112. The facing area between the lower electrode layers 112 increases the capacitance of the capacitor structure 102.

Those of ordinary skill in the art can understand that the above-mentioned embodiments are specific examples for realizing the present disclosure, and in practical application, various changes can be made to it in form and detail without departing from the present disclosure spirit and scope of the embodiments. Any person skilled in the art can make various changes and modifications without departing from the spirit and scope of the embodiments of the present disclosure. Therefore, the protection scope of the embodiments of the present disclosure should be subject to the scope defined by the claims.

The invention claimed is:

1. A semiconductor structure, comprising:
 a bit line, a transistor structure, and a capacitor structure, sequentially arranged along a first direction, wherein the capacitor structure extends along the first direction;
 wherein each of the transistor structure and the capacitor structure comprises a semiconductor layer, wherein the semiconductor layer extends along the first direction;
 wherein the semiconductor layer comprises a capacitor region facing the capacitor structure, wherein the capacitor structure at least comprises: a lower electrode layer, a capacitor dielectric layer and an upper electrode layer, sequentially surrounding sidewalls of the capacitor region extending along the first direction;

wherein at least a part of the lower electrode layer surrounds the sidewalls of the capacitor region extending along the first direction, and also surrounds a bottom of the upper electrode layer and the sidewalls extending along the first direction; and wherein the capacitor dielectric layer is located between the upper electrode layer and the lower electrode layer;

wherein the lower electrode layer forms a first annular groove by itself, and wherein the direction a bottom of the first annular groove points to a notch of the first annular groove is the first direction; wherein the capacitor dielectric layer covers the bottom and side walls of the first annular groove, and wherein the capacitor dielectric layer forms a second annular groove by itself; wherein the direction a bottom of the second annular groove points to a notch of the second annular groove is the first direction; and wherein the upper electrode layer fills the second annular groove.

2. The semiconductor structure of claim 1, wherein a shape of the first annular groove and a shape of the second annular groove projected on a cross-section perpendicular to the first direction each comprises a circular ring or a square.

3. The semiconductor structure of claim 1, wherein, along the first direction, the capacitor region has an end face away from the transistor structure, wherein the capacitor dielectric layer covers the end face, wherein the upper electrode layer covers a side of the capacitive dielectric layer away from the end face.

4. The semiconductor structure of claim 1, wherein the upper electrode layer comprises a diffusion barrier layer and an electrical connection layer stacked in sequence, wherein the diffusion barrier layer covers a surface of the capacitor dielectric layer away from the lower electrode layer, wherein the electrical connection layer covers a surface of the diffusion barrier layer away from the capacitor dielectric layer.

5. The semiconductor structure of claim 1, wherein the transistor structure comprises a plurality of sub-transistor structures spaced at intervals along a third direction, wherein the capacitor structure comprise a plurality of sub-capacitor structures, spaced at intervals along the third direction, wherein the semiconductor layer comprise a plurality of sub-semiconductor layers spaced at intervals along the third direction, and wherein the sub-transistor structures have an one-to-one correspondence to the sub-capacitor structures;

wherein along the first direction, each of the sub-semiconductor layers comprises a first region and a sub-capacitor region, wherein an end face of the first region away from the sub-capacitor structures is in contact with the bit line;

wherein each of the sub-transistor structures comprises the first region and a gate structure, wherein the gate structure surrounds a part of the sidewalls of the first region extending along the first direction; wherein each of the sub-capacitor structures comprises the sub-capacitor region and the lower electrode layer stacked in sequence, a part of the capacitor dielectric layer and a part of the upper electrode layer, wherein the lower electrode layer surrounds the sidewalls of the sub-capacitor region extending along the first direction, and wherein the lower electrode layer has a one-to-one correspondence to the sub-capacitor region.

6. The semiconductor structure of claim 5, wherein a length of the lower electrode layer in the first direction is less than or equal to a length of the sub-capacitor region in the first direction.

7. The semiconductor structure of claim 5, wherein the capacitor dielectric layer is shared by a plurality of the sub-capacitor structures in a same capacitor structure and arranged at intervals along the third direction.

8. The semiconductor structure according to claim 5, wherein the upper electrode layer is shared by a plurality of the sub-capacitor structures in the same capacitor structure and arranged at intervals along the third direction.

9. A method of manufacturing a semiconductor structure, comprising:

forming a plurality of bit lines, a plurality of transistor structures and a plurality of capacitor structures in sequence along a first direction, wherein the plurality of capacitor structures extends along the first direction, and wherein each of the plurality of transistor structures and each of the plurality of capacitor structures comprises a semiconductor layer, wherein the semiconductor layer extends along the first direction;

wherein, the semiconductor layer comprises a capacitor region facing the capacitor structure, wherein the capacitor structure at least comprises: a lower electrode layer, a capacitor dielectric layer, and an upper electrode layer sequentially surrounding sidewalls of the capacitor region extending along the first direction, wherein at least a part of the lower electrode layer surrounds sidewalls of the capacitor region extending along the first direction, and also surrounds a bottom of the upper electrode layer and a sidewall extending along the first direction, and wherein the capacitor dielectric layer is located between the upper electrode layer and the lower electrode layer;

wherein the step of forming the bit line and the transistor structure comprises:

in a second direction, arranging each of the plurality of the bit lines at intervals and arranging each of the plurality of the transistor structures at intervals, wherein each of the plurality of bit lines is in an one-to-one correspondence with each of the plurality of transistor structures, and each of the plurality of transistor structures comprises a portion of a gate structure, wherein the gate structure extends along the second direction, and wherein the first direction and the second direction intersect;

wherein the step of forming the plurality of bit line and the transistor structures further comprises:

in a third direction, arranging a plurality of sub-transistor structures at intervals and arranging a plurality of sub-semiconductor layers at intervals, wherein at least a part of each of the plurality of the sub-transistor structures arranged along the third direction, at least a part of each of the plurality of the sub-semiconductor layers arranged along the third direction constitute the semiconductor layer;

wherein, along the first direction, the sub-semiconductor layer comprises a first region and a sub-capacitor region, wherein the first region is opposite to the sub-transistor structure; wherein forming the plurality of sub-capacitor structures comprises:

forming a first dielectric layer between adjacent sub-capacitor regions, and forming a third annular groove between the first dielectric layer and the sub-capacitor region, wherein a direction of a bottom of the third annular groove points to a notch is the first direction, and the third annular groove has an one-to-one correspondence to the sub-capacitor region;

forming a lower electrode layer, wherein the lower electrode layer covers the bottom and sidewalls of the third annular groove, wherein the lower electrode layer surrounds a first annular groove by itself, and wherein a direction of a bottom of the first annular groove points to a notch is the first direction, and wherein the lower electrode layer has an one-to-one correspondence to the sub-capacitor region;

forming a capacitor dielectric layer, wherein the capacitor dielectric layer covers at least the bottom and sidewalls of the first annular groove, wherein the capacitor dielectric layer surrounds a second annular groove by itself, wherein a direction that a bottom of the second annular groove points to a notch of the second annular groove is the first direction; and forming an upper electrode layer, wherein the upper electrode layer at least fills the second annular groove;

wherein the sub-capacitor region, the lower electrode layer, a part of the capacitor dielectric layer and a part of the upper electrode layer constitute the sub-capacitor structure.

10. The manufacturing method of claim 9, wherein, on a cross-section perpendicular to the first direction, the cross-sectional shape of the third annular groove comprises a circular ring or a square.

11. The manufacturing method of claim 9, wherein the step of forming the lower electrode layer comprises:

forming an initial lower electrode layer, wherein the initial lower electrode layer conformally covers a surface of the first dielectric layer and wherein the third annular groove exposes the sub-capacitor region; and removing the initial lower electrode layer by etching on an end surface of the sub-capacitor region away from the first region, and wherein the initial lower electrode layer remains as the lower electrode layer.

12. The manufacturing method of claim 9, wherein the step of forming the first dielectric layer and the third annular groove comprises:

forming second dielectric layers on sidewalls of the sub-capacitor region extending along the first direction, wherein a space is configured to be between adjacent second dielectric layers;

forming a first dielectric layer, wherein the first dielectric layer is located in the space, and wherein the first dielectric layer exposes a part of the second dielectric layer; and removing the second dielectric layer to form the third annular groove by using the first dielectric layer as a mask.

13. The manufacturing method of claim 12, wherein the step of forming the first dielectric layer further comprises:

forming an initial first dielectric layer, wherein the initial first dielectric layer fills the space, and wherein the initial first dielectric layer covers an end face of the second dielectric layer away from the first region; and etching the initial first dielectric layer to expose at least the end face of the second dielectric layer away from the first region, wherein the initial first dielectric layer remains as the first dielectric layer.

* * * * *